(12) United States Patent
Schroeder et al.

(10) Patent No.: US 8,486,766 B2
(45) Date of Patent: Jul. 16, 2013

(54) METHOD FOR THERMALLY CONTACTING OPPOSING ELECTRICAL CONNECTIONS OF A SEMICONDUCTOR COMPONENT ARRANGEMENT

(75) Inventors: Matthias Schroeder, Stadtroda (DE); Dominic Schroeder, Warendorf (DE); Petra Hennig, Moersdorf (DE)

(73) Assignee: JENOPTIK Laser GmbH, Jena (DE)

( * ) Notice: Subject to any disclaimer, the term of this patent is extended or adjusted under 35 U.S.C. 154(b) by 0 days.

(21) Appl. No.: 13/395,121

(22) PCT Filed: Sep. 8, 2010

(86) PCT No.: PCT/EP2010/063174
§ 371 (c)(1),
(2), (4) Date: Apr. 3, 2012

(87) PCT Pub. No.: WO2011/029846
PCT Pub. Date: Mar. 17, 2011

(65) Prior Publication Data
US 2012/0252144 A1    Oct. 4, 2012

(30) Foreign Application Priority Data
Sep. 9, 2009 (DE) .................... 10 2009 040 835

(51) Int. Cl.
*H01L 21/44* (2006.01)
(52) U.S. Cl.
USPC .................................. 438/122; 257/E21.506
(58) Field of Classification Search
USPC .................................. 438/25, 119
See application file for complete search history.

(56) References Cited

U.S. PATENT DOCUMENTS

| 3,351,698 | A | 11/1967 | Marinace |
| 6,448,642 | B1 | 9/2002 | Bewley et al. |
| 7,018,870 | B2 * | 3/2006 | Boyer et al. ................... 438/122 |
| 7,466,732 | B2 * | 12/2008 | Stephens, IV ................... 372/35 |
| 7,572,677 | B2 * | 8/2009 | Chiu et al. ..................... 438/118 |
| 2002/0181523 | A1 | 12/2002 | Pinneo et al. |
| 2005/0087735 | A1 | 4/2005 | Behringer et al. |
| 2006/0029117 | A1 | 2/2006 | Valiente |
| 2008/0056314 | A1 * | 3/2008 | Coleman et al. ................ 372/36 |
| 2008/0181277 | A1 | 7/2008 | Konig et al. |

FOREIGN PATENT DOCUMENTS

| EP | 1341275 A2 | 9/2003 |
| EP | 1906496 A2 | 4/2008 |
| GB | 1083200 A | 9/1967 |
| JP | 52020782 A | 2/1977 |

OTHER PUBLICATIONS

Lorenzen et al., "Comparative performance studies of indium and gold-tin packaged diode laser bars", Proceedings of the SPIE, vol. 6104, 12 pages, Feb. 15, 2006.

(Continued)

*Primary Examiner* — Chandra Chaudhari
(74) *Attorney, Agent, or Firm* — Skaar Ulbrich Macari, P.A.

(57) ABSTRACT

The invention relates to thermally contacting a semiconductor component arrangement, wherein at least one of two heat conducting bodies disposed on opposite sides of the semiconductor component arrangement is brought into contact with a contact surface of the semiconductor component arrangement by means of a metal layer under the application of a force, wherein the metal layer melts during solidification of a locking agent, forming an adhesive bond between the two heat transfer bodies over the entire region thereof.

21 Claims, 7 Drawing Sheets

OTHER PUBLICATIONS

English translation of the International Preliminary Report on Patentability for International Application PCT/EP2010/063174, Mar. 22, 2012, 11 pages.

Pittroff et al., "Mounting of laser bars on copper heat sinks using Au/Sn solder and CuW submounts", 2002 Electronic Components and Technology Conference, IEEE, May 28, 2002, 6 pages.

* cited by examiner

Fig. 3c

# METHOD FOR THERMALLY CONTACTING OPPOSING ELECTRICAL CONNECTIONS OF A SEMICONDUCTOR COMPONENT ARRANGEMENT

PRIORITY

This application claims the benefit of International Application PCT/EP2010/063174, filed on Sep. 8, 2010, and German Patent Application No. 102009040835.5, filed on Sep. 9, 2009, both of which are hereby incorporated herein by reference in their entirety.

FIELD

The invention relates to a method for producing a semiconductor module, for example a diode laser component, in which the electrical connections of a semiconductor component arrangement, for example a laser diode bar, are thermally contacted.

BACKGROUND

A method for thermal and electrical contacting of both sides of a laser diode bar, in which in each case a copper electrically conductive heat-conducting body, formed as a cooling element, is soldered by means of an indium solder to each opposing electrical contact surface of the laser diode bar, is known from the publication of the Proceedings of SPIE 6104-04 (2006) "Comparative performance studies of indium and gold-tin packaged diode laser bars" by Dirk Lorenzen et al.

An advantage of this method is the small number of components required to produce the diode laser component. The use of a cost-favourable and highly heat-conductive heat-conducting body material is also advantageous. A disadvantage of this method is the mechanical stress which is introduced into the laser diode bar by the thermally advantageous copper by cooling from the solidification temperature of the solder (157° C.) to room temperature, and negatively influences its optical qualities.

From published patent application EP 1 341 275 A2 a further method is known for thermally contacting electrical connections of a laser diode bar, which achieves the object of a mechanically low-stress contacting of the laser diode bar in that, dispensing with layers of solder, the laser diode bar is contacted both electrically and thermally on both sides in friction-locked manner by in each case an electrically conductive heat-conducting body.

An advantage of this method and of the arrangement produced with this method is the low mechanical stress, compared with a soldered connection with heat-conductive bodies, thermally mismatched in terms of expansion vis-à-vis the laser diode bar, which ensures a high uniformity of power of the optical radiation from emitters of a laser diode bar.

A disadvantage of this method is the inadequate thermal contacting of the laser diode bar which manifests itself in too low an electro-optical conversion efficiency and too low an optical maximum power.

A further disadvantage of this method is the requirement for fixing means which are provided to guarantee the friction-locked connection not only to form connections but also to maintain the friction-locked connection and must remain in the diode laser component.

SUMMARY

The object of the invention is to describe a method for thermally contacting the electrical connections of a laser diode bar which does not have the above-named disadvantages.

This object is achieved by a method for producing a semiconductor module according to claim 1. Developments of the method according to the invention are the subject of the dependent claims.

According to the invention in a first method step the components essential for the production according to the invention of the semiconductor module are provided with the features specific to the invention. These include (i) a semiconductor component arrangement which on a first side has at least one first electrical connection with a first contact surface and on a second side opposite the first side at least one second electrical connection with a second contact surface, (ii) a first heat-conducting body, (iii) at least one second heat-conducting body, (iv) a first metallic layer, (v) at least one second metallic layer and (vi) at least one joining means.

The semiconductor component arrangement can, in the simplest case, be a single semiconductor component, for example a laser diode element, wherein the electrical connections are formed by at least one first electrically conductive contact layer—for example a first metallization—on the first side of the semiconductor component and at least one second electrically conductive contact layer—for example a second metallization—on the second side of the semiconductor component and the first contact surface is arranged on the side of the first electrically conductive contact layer facing away from the semiconductor component and the second contact surface is arranged on the side of the second electrically conductive layer facing away from the semiconductor component. Laser diode elements according to the invention include laser diodes with a single emitter, laser diodes with several emitters arranged side-by-side and/or on top of each other and laser diode bars with a large number of emitters arranged in series side-by-side. Alternatively, the semiconductor component arrangement can be formed as a sub-assembly of a semiconductor module—for example as diode laser sub-assembly—by having at least one semiconductor component, for example one or more laser diode elements, as well as a first electrically conductive contact body which provides the first electrical connection and a second electrically conductive contact body which provides the second electrical connection. The first electrically conductive contact body of a first electrically conductive joining means is fixed in material-locked manner to a first side of the semiconductor component and the second electrically conductive contact body in material-locked manner by means of a second electrically conductive joining means to a second side of the semiconductor component opposite the first side of the semiconductor component, wherein the first contact surface is arranged on the side of the first electrically conductive contact body facing away from the semiconductor component and the second contact surface is arranged on the side of the second electrically conductive contact body facing away from the semiconductor component.

According to the invention sub-assemblies with only one contact body are of course also conceivable and can be used to carry out the method according to the invention.

The electrical conductivity of the contact bodies can be provided by an electrically conductive material of a core body of the contact body or by an electrically conductive layer on an electrically insulating core body, for example a core body made of electrically insulating material.

While, where the semiconductor component arrangement is formed as a semiconductor component, the first contact surface is provided as first electrical contact surface for the first electrical and thermal contacting of the semiconductor component and the second contact surface as second electrical contact surface for the second electrical and thermal contacting of the semiconductor component, where the semiconductor component arrangement is formed as sub-assembly of a semiconductor module, the first contact surface of the first contact body is basically initially provided as a first thermal contact surface for the first thermal contacting of the sub-assembly—but combined with the possible option of electrical contacting of same—and the second contact surface of the second contact body basically initially as second thermal contact surface for the second thermal contacting of the sub-assembly—but combined with the possible option of electrical contacting of same.

Preferably the electrically conductive contact bodies have a thermal expansion coefficient which differs by not more than 2 ppm/K from that of the semiconductor component. This is possible for semiconductor components which, with regard to proportions by weight, atom and/or volume, consist mainly of gallium arsenide, indium phosphide, gallium nitride, zinc oxide or silicon, if the electrically conductive contact bodies contain tungsten, molybdenum, carbon, boron nitride and/or silicon carbide, optionally in combination with a metal of a higher thermal expansion coefficient, for example copper, silver or aluminium. In this way, electrically conductive contact bodies matched in terms of expansion with regard to the semiconductor component permit low-stress contacting in material-locked manner of the semiconductor component by the electrically conductive contact bodies using a reliable hard solder, for example a gold-tin solder.

However, for reasons of cost, the electrically conductive contact bodies do not occupy sufficient space for the necessary heat expansion in a semiconductor module. Manufacturers or users will therefore preferably attach heat-conducting bodies, larger in respect of their volume, in particular to the electrically conductive contact bodies or in general to the semiconductor component arrangement.

Preferably the first heat-conducting body is larger in at least one of the directions in which it extends than the semiconductor component arrangement in one of the directions in which it extends parallel to the first and/or second contact surface; likewise the second heat-conducting body is preferably larger in at least one of the directions in which it extends than the semiconductor component arrangement in one of the directions in which it extends parallel to the first and/or second contact surface.

To prepare the thermal contacting of the semiconductor component arrangement with the heat-conducting bodies, in the second method step according to the invention the semiconductor component arrangement is arranged between the first and second heat-conducting bodies such that a first contact section of the first heat-conducting body lies opposite the first contact surface, and a second contact section of the second heat-conducting body lies opposite the second contact surface. Preferably the first heat-conducting body has a first connecting section and the second heat-conducting body a second connecting section, wherein the first connecting section of the first heat-conducting body lies opposite the second connecting section of the second heat-conducting body away from the semiconductor component arrangement. According to the invention at least sections of the first metallic layer are arranged between the first contact section and the first contact surface and at least sections of the second metal layer are arranged between the second contact section and the second contact surface.

By away from the semiconductor component arrangement is meant that region outside the projection perpendicular to the contact surfaces of the semiconductor component arrangement. To this extent, the contact sections of the heat-conducting bodies are not away from the semiconductor component arrangement.

In the first or second method step the first metallic layer can be applied to the first contact surface or to a first heat-entry surface, facing the semiconductor component arrangement, of the first contact section and/or the second metallic layer can be applied to the second contact surface or to a second heat-entry surface, facing the semiconductor component arrangement, of the second contact section. This application can be achieved by deposition from the gas phase (vaporization, sputtering on, CVD), by galvanic deposition from an electrolyte etc.

Moreover it is possible in each case to provide both surfaces, i.e. both the contact surface and the heat-entry surface respectively, with one or more metallic layers.

Alternatively or optionally the first and second metallic layers can also be present physically individually as foils or sheets, for example as so-called preforms.

In the third method step according to the invention at least one force is generated, of which at least components are effectively oriented by one of the two heat-conducting bodies in the direction of the other heat-conducting body.

Preferably such a force is applied as external force from outside onto at least one of the two heat-conducting bodies with the result that at least components thereof are oriented in the direction of the other heat-conducting body. However, it is also possible to produce an internal force which is brought about for example by shrinking a volume of a joining means introduced between the heat-conducting bodies.

The force according to the invention thus exerts a pressure on the semiconductor component arrangement, the first metallic layer and the second metallic layer. It can be applied as external force for example on one side perpendicular to the first contact surface on the side of the first heat-conducting body facing away from the semiconductor component arrangement, while the second heat-conducting body rests, with its side facing away from the semiconductor component arrangement, on a support surface. Conversely, an external force can also be applied on one side perpendicular to the second contact surface to the side, facing away from the semiconductor component arrangement, of the second heat-conducting body while the first heat-conducting body rests with its side facing away from the semiconductor component arrangement, on a support surface. Furthermore, two equal oppositely directed external forces can be applied to the outer sides, facing away from the semiconductor component arrangement, of the first and second heat-conducting bodies which combine to exert a pressure on the semiconductor component arrangement, the first metallic layer and the second metallic layer.

Typical forces according to the invention lie in the range of from 0.1N to 1 kN and may vary during the method.

Moreover, in the third method step according to the invention, a material-locked connection (adhesive bonding) of the two heat-conducting bodies is achieved by a solidification of the joining means. According to the invention, the joining means is explicitly involved in forming the connection—in other words: essential for creating the material-locked connection of the two heat-conducting bodies. Where the above-named connecting sections exist, preferably at least sections of the joining means are arranged between the first and the second connecting sections.

The joining means can already be introduced in the second method step between the first and second connecting sections, i.e.: before the pressure according to the invention has been applied to one or both heat-conducting bodies. However, it can also not be applied until the third method step between the first and second connecting sections, wherein the pressure according to the invention is already present before the introduction and remains, at least qualitatively, during the introduction.

The joining means can be present prior to solidification in liquid, paste or solid form. If it is present in solid form then, in order to achieve a wetting of the first and/or second connecting sections, it is brought, preferably by exposure to force or heat on the basis of physical and/or chemical effects, into a liquid or paste state from which it solidifies again while said force or heat is maintained or after its removal.

The joining means is preferably characterized in solidified state by lower flexibility and higher bending strength, with the result that it remains crack-resistant against internal shearing and peeling forces, and can accordingly absorb high shearing and peeling forces.

Such joining means include for example thermosetting—for example epoxide-containing—adhesives, metallic solders, glass solders and cements.

In particular one of the named joining means is thus to be maintained, in solidified state, in the position of a friction lock between the second contact section and the second contact surface, with the result that even after removal of the external force, in a further, optional method step, an adequate thermal contact remains between the second contact section and the second contact surface.

Essential to the invention in the third method step is the feature that none of the metallic materials of the second metallic layer melts during the application and/or maintenance of the external force and/or the solidification of the joining means. This means that the temperature in the second metallic layer in the third method step does not exceed the melt temperature of the metallic material of the second metallic layer with the lowest melt temperature.

Where a material-locked connection is formed between the second contact section and the semiconductor component arrangement, this means that it takes place by solids diffusion at least of one metallic material of the second metallic layer into a metallic surface region of the second contact section and/or of the second electrical connection and/or by solids diffusion of at least one metallic material of the surface region of the second contact section and/or of the second electrical connection into the second metallic layer without one of the metallic materials of the second metallic layer, of the surface region of the second contact section or of the second electrical connection, one of its formed compounds or one of their formed mixtures with one another or with one or more of its formed compounds passing into a liquid state. As examples of such compounds, intermetallic phases are to be named, as examples of such mixtures, eutectics from the metals and/or their intermetallic phases.

The contacting method according to the invention thus represents in principle a "metal-layer-supported clamping maintained by offset material locking" referred to below under the abbreviation "clamping" and which differs from a soldering according to the state of the art in that the metal layer involved in forming the connection melts in the case of the soldering but not in the case of the clamping according to the invention.

An advantage of the invention is that the temperature in the second metallic layer and thus also the temperature of the components to be connected when forming the force- or material-locked connection when the second metallic layer is involved is lower than in the case of a soldering method in which the solder material changes into the liquid state and solidifies at a solidification temperature which is above the temperature permissible according to the invention. As a result the temperature difference which is effective for an introduction of stress when cooling through the different thermal expansion coefficients after formation of the compound is, according to the invention, lower than during a soldering according to the state of the art. When using heat-conducting bodies of a higher thermal expansion coefficient than that of the semiconductor component arrangement the compressive stress introduced with the method according to the invention is in lateral direction, i.e. in the largest direction in which the semiconductor component arrangement extends parallel to the first and/or second contact surface, advantageously substantially lower than in the case of a soldering.

When applying the method according to the invention to a laser diode bar, the inventors surprisingly found that, when selecting the corresponding materials and process parameters, only a comparable electro-optical conversion coefficient was achievable compared with that of the customary soldering method (see first embodiment example).

Although the second metal layer used for thermally contacting did not melt, it was possible to achieve a thermal contacting of the laser bar which equals in principle that of the case in which the second metal layer melted in a soldering process.

It was also surprisingly found that the compressive stress introduced by clamping in transverse direction, i.e. in direction perpendicular to that of the first and/or second contact surface, scarcely has a negative influence on the optical property of the emitted radiation of the laser diode bar. On the other hand the uniformity of power via the emitters of the laser diode bar in the case of clamping is distributed clearly more homogeneously than in the case of the soldering (see first embodiment example).

An advantageous effect of the clamping according to the invention is moreover that the material locking mediated by the joining means—for example between the two connecting sections—exerts an irreversible supporting effect on the thermal connection between the second heat-conducting body and the semiconductor component arrangement, something which on the one hand is essential for the friction-locked clamping and on the other hand saves the weakly-formed material locking of the material-locked clamping from harmful peeling stress.

Furthermore, said material locking makes the use of friction-locked connection and/or fixing means obsolete, which manifests itself in a smaller structure and reduced costs of the semiconductor module.

Overall, the essential advantage of the invention is that, in particular with cost-favourable, highly heat-conductive heat-conducting bodies of copper and/or aluminium, even though their thermal expansion coefficients differ greatly compared with the semiconductor component arrangement, a good and reliable thermal contacting of the semiconductor component arrangement can be achieved which moreover in the case of laser diode elements guarantees very homogeneous optical properties of the radiation of individual emitters of a laser diode bar.

An increase in the temperature of the joining means which also affects the temperature of the second metallic layer can certainly be provided in the third method step, essential according to the invention, for example in order to achieve a liquefaction and/or a solidification of the joining means. However, during the processing of the joining means, according to the invention, the temperature in the second layer remains below the melting point of each of its constituents. Even if the temperature in the joining means is higher over an extended period, for example 1 second to 10 minutes, than the lowest melt temperature of a material of the second layer, by cooling the second layer a stationary temperature gradient can be established between the joining means and the second layer, which in the second layer lies below the lowest melting point of one of its materials. Without such a cooling the temperature in the joining means can be maintained above the lowest melt temperature of a material of the second layer for a shorter period, for example 1 millisecond to 1 second, if the unsteady temperature gradient formed by the time-delayed heat diffusion at no time in any region of the second layer has a temperature which is above the melting point of the region concerned.

Moreover it can be advantageous if in the third method step the temperature of the second layer lies at least sometimes above room temperature. As the strength properties of most materials are reduced as the temperature is increased, in the case of the formation of a force-locking connection between the second contact section and the second contact surface, the thermal contact between them can be improved by increased plastic deformation of the second layer. The situation is similar in the case of the formation of a material-locked connection between the second contact section and the semiconductor component arrangement by solids diffusion. The behaviour of the diffusion coefficient determining the diffusion behaviour of a first substance in a second substance is similar to that of the Arrhenius equation, according to which diffusion increases and/or accelerates if temperature is increased. Thus a thermal contact is also improved when a material-locked compound is formed if temperature is increased.

To improve the wetting of materials of the second metallic layer on the second contact surface of the semiconductor component arrangement or on the heat-entry side, opposite the second contact surface, of the second contact section, at least the third method step should take place preferably in a vacuum or in an atmosphere which is chemically inert or reductive with regard to the metallic material of the first and/or second metallic layers. If the semiconductor component arrangement or heat-conducting bodies are coated with the metallic layer in a vacuum, then preferably also the arrangement of the components relative to one another in the second method section is to be carried out under this vacuum without allowing the coating to come into contact with the ambient atmosphere.

To form a material locking between the second metallic layer and the semiconductor component arrangement and/or between the second metallic layer and the second contact section, it is to be preferred that the second contact surface and/or the heat-entry surface have a diffusion-friendly metallic surface coating, for example a noble metal. Preferably this diffusion layer is a gold layer, the thickness of which preferably lies in the range of from 50 nm to 1 μm. A diffusion barrier lying thereunder, for example a layer of nickel, palladium, platinum or refractory metal, is not necessary according to the invention, but can be provided, for example to improve the adhesive strength of the diffusion layer on the semiconductor component arrangement or the second contact section.

According to the invention at least the thermal contacting of the second side of the semiconductor component arrangement is subjected to the metal-layer-supported clamping maintained by offset material locking.

The first side of the semiconductor component arrangement can be contacted by a conventional soldering, in particular if this is the side of the semiconductor component arrangement on which most of the heat is produced when the semiconductor module is operating. In the case of a laser diode element this is the epitaxial side of the semiconductor component arrangement, wherein the second side corresponds to the substrate side. On the epitaxial side in most cases requirements are higher in respect of the thermal, electrical and mechanical reliability as regards the thermal and preferably concomitant electrical contact which, for example, can be met by a gold-tin hard solder providing that the thermal expansion coefficient of the first heat-conducting body differs by no more than preferably 2 ppm/K from that of the semiconductor component arrangement. Preferably such a first heat-conducting body mainly consists, with regard to its proportions by weight/atom and/or volume, of a metal-containing composite, for example a diamond-silver composite.

On the other hand, the first side of the semiconductor component arrangement can also analogously and additionally to the second side be thermally contacted by a metal-layer-supported clamping maintained by offset material locking wherein in the third method step the temperature in the first and the second metallic layers preferably does not exceed the melt temperatures of those materials in the respective layers with the respective lowest melt temperatures.

In the third method step the formation of a friction-locked connection between the second contact section and the second contact surface and the formation of a friction-locked connection can take place between the first contact section and the first contact surface which is maintained by the solidified joining means between the first and the second connecting section.

On the other hand, in the third method step, the formation of a material-locked connection between the second contact section and the semiconductor component arrangement can take place by solids diffusion at least of one metallic material of the second metallic layer into a metallic surface region of the second contact section and/or of the second electrical connection and/or by solids diffusion of at least one metallic material of the surface region of the second contact section and/or of the second electrical connection into the second metallic layer without one of the metallic materials of the second metallic layer, of the surface region of the second contact section or of the second electrical connection, one of its formed compounds or one of their formed mixtures with one another or with one or more of its formed compounds passing into a liquid state and
the formation of a material-locked connection between the first contact section and the semiconductor component arrangement by solids diffusion at least of one metallic material of the first metallic layer takes place into a metallic surface region of the first contact section and/or of the first electrical connection and/or by solids diffusion of at least one metallic material of the surface region of the first contact section and/or of the first electrical connection into the first metallic layer without one of the metallic materials of the first metallic layer, of the surface region of the first contact section or of the first electrical connection, one of its formed compounds or one of their formed mixtures one under the other or with one or more of its formed compounds passing into a liquid state.

The wetting of the joining partners by a or preferably the material of the first or second layer is a condition of the formation of the material-locked connection. The diffusionwillingnes of the materials of the wetting surface additionally supports the process of forming the material-locked connection. Noble metals and relatively soft, low-melting metals are excellent wetting partners. Therefore, the first and/or second layer preferably contain at least one material with a chemical element from the group indium, tin, lead and cadmium. This material can on the one hand consist solely of one of the said chemical elements, in particular the first and/or second metallic layer can, with regard to proportions by weight, atom and/or volume, consist mainly or completely of tin, lead, cadmium or—particularly preferably—indium. On the other hand the material can consist of eutectic mixtures of the said chemical elements with other chemical elements or the named chemical elements, in particular the first and/or second metallic layer can, with regard to proportions by weight, atom and/or volume, consist mainly or completely of eutectic lead-tin, cadmium-tin or—particularly preferably—indium-tin.

To improve the wetting and/or diffusion in the case of the material-locked connection or during the third method step the temperature in the first and/or second layer is at least sometimes above room temperature. Preferably the temperature during the third method step in the first and/or second layer is at least sometimes above 30° C. For example it lies sometimes between 50° and 100° C. The solidification of the joining means can also be encouraged in this temperature range in that the solidification is accelerated timewise and/or the strength of the solidified joining means is increased.

BRIEF DESCRIPTION OF THE DRAWINGS

The invention is described in more detail below with the help of five embodiment examples. There are shown schematically and not necessarily to scale in FIG. 1a a side view of an arrangement according to the invention of the components in the second method step of a first embodiment example for the production according to the invention of a diode laser component, FIG. 1b a side view of an arrangement according to the invention of the components in the third method step of the first embodiment example, FIG. 1c a current-light graph/current-voltage graph of a soldered diode laser component, FIG. 1d a current-light graph/current-voltage graph of the diode laser component produced according to the first embodiment example, FIG. 1e a near-field profile of the optical power distribution of emitters of a soldered diode laser component, FIG. 1f a near-field profile of the optical power distribution of emitters of a diode laser component produced according to the first embodiment example, FIG. 2a a side view of an arrangement according to the invention of the components for carrying out a first section of the second method step of a second embodiment example for the production according to the invention of a diode laser component, FIG. 2b a side view of an arrangement according to the invention of the components for carrying out a second section, time-delayed vis-à-vis the first section, of the second method step of the second embodiment example, FIG. 2c a side view of an arrangement according to the invention of the components in the third method step of the second embodiment example, FIG. 3a a front view of an arrangement according to the invention of the components in the second method step of a third embodiment example for the production according to the invention of a diode laser component, FIG. 3b a front view of an arrangement according to the invention of the components in a first section of the third method step of the third embodiment example, FIG. 3c a front view of an arrangement according to the invention of the components in a second section of the third method step of the third embodiment example, time-delayed vis-à-vis the first section, FIG. 4a a side view of the components of a diode laser sub-assembly for use in the production of a diode laser component according to a fourth embodiment example of the method according to the invention, FIG. 4b a side view of the diode laser sub-assembly of FIG. 4a, FIG. 4c a side view of an arrangement according to the invention of the components in the second method step of the fourth embodiment example for the production according to the invention of a diode laser component, FIG. 4d a side view of an arrangement according to the invention of the components in the third method step of the fourth embodiment example, FIG. 5a a front view of the components of a diode laser sub-assembly for use in the production of a diode laser component according to a fifth embodiment example of the method according to the invention, FIG. 5b a front view of the diode laser sub-assembly of FIG. 5a, FIG. 5c a side view of an arrangement according to the invention of the components in the second method step of the fifth embodiment example for the production according to the invention of a diode laser component, FIG. 5d a front view of an arrangement according to the invention of the components in the third method step of the fifth embodiment example,

DETAILED DESCRIPTION

The hatchings used denote the joining means and are not to be interpreted as a cross-section view. Contact layers formed as metallizations 17 and 18 on opposite sides of a laser diode element 10 are shown only in FIGS. 1a and 1b of the first embodiment example and are taken as given in all other Figures but omitted for reasons of clarity.

Identical reference numbers denote identical or equivalent objects. Reference is made to the list of reference numbers with regard to reference numbers not explained in the description.

First Embodiment Example

A first heat-conducting body 20 of copper and a second heat-conducting body 30 of copper are provided for the production of a diode laser component according to a first embodiment example of the method according to the invention. Both heat-conducting bodies 20 and 30 are coated externally with a nickel and a gold layer. The first heat-conducting body 20 has a first connecting section 26 and a first contact section 25 with a first connection surface 21. The second heat-conducting body 30 has a second connecting section 36 and a second contact section 35 with a second connection surface 31. A first indium layer 51 is applied to the first connection surface 21 and a second indium layer 52 is applied to the second connection surface 31.

Figure 1A:
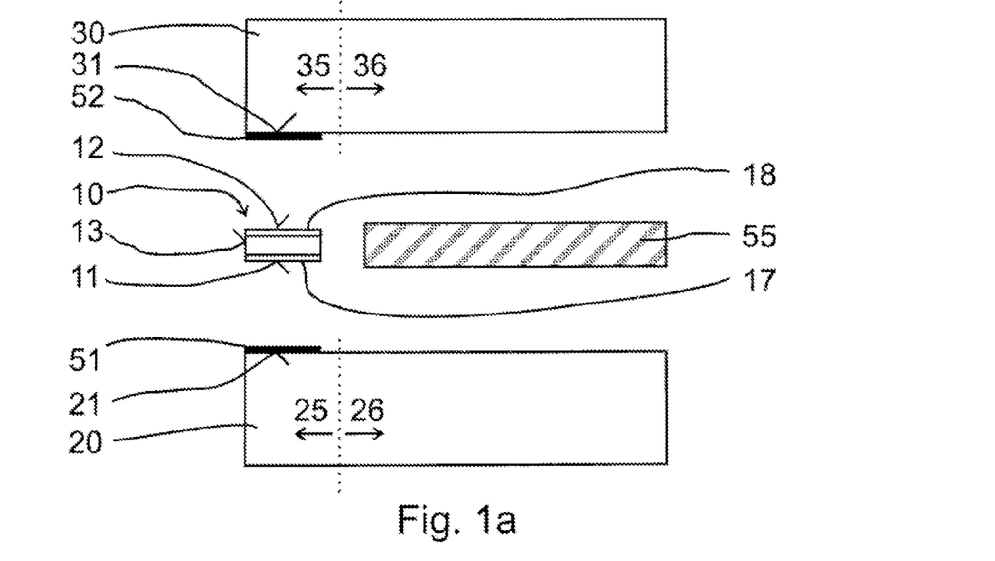
Figure 1B:
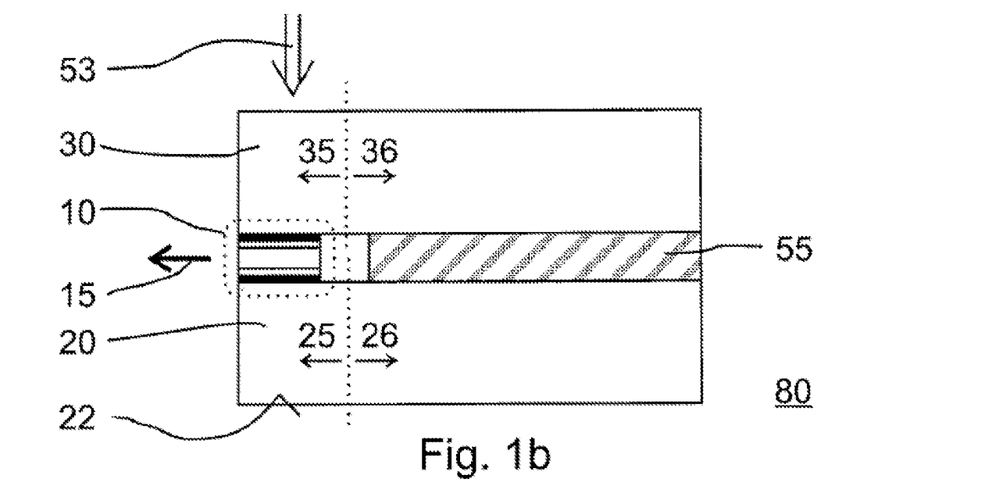

The first heat-conducting body 20 is oriented vis-à-vis the second heat-conducting body 30 in the second method step such that the first connection surface 21 and the second connection surface 31 lie opposite each other (FIG. 1a).

Furthermore, in the first method step a laser diode bar 10, which has on a first side a first metallization 17 with a gold-plated external electrical contact surface 11 and on a second side a second metallization 18 with a gold-plated external contact surface 12, is provided as semiconductor component arrangement. In the second method step the laser diode bar 10 is introduced between the first contact section 25 and the second contact section 35 such that its first electrical contact surface 11 lies opposite the first connection surface 21 and its second electrical contact surface 12, opposite the first electrical contact surface 11, lies opposite the second connection surface 31. A joining means 55 which, at the time of introduction need not necessarily be present as a layer but can be applied as a drop or a field of drops onto the surface of the first connecting section 26 and/or the second connecting section 36 lying opposite the respective other connecting section, is introduced between the first connecting section 26 and the second connecting section 36. In this case an epoxy resin adhesive ("epoxy" for short) filled with ceramic particles is used as electrically insulating joining means 55. On the side facing away from the joining means the laser diode bar 10 has a radiation emission surface 13 which lies perpendicular to the two electrical contact surfaces 11 and 12.

In the third method step a compressive force 53 is applied to the side facing away from the laser diode bar of the second contact section 35. The first heat-conducting body 20 lies with its side 22 facing away from the laser diode bar on an immobile or unmoved counterpiece which is not represented in FIG. 1b and serves as a stop. With this stop, a counterforce, opposed to compressive force 53, builds up which together with the compressive force 53 ensures a pressure loading of the indium layers 51 and 52. The temperature of the arrangement is increased from room temperature to 70° C. in order to effect, support, or accelerate the curing and the concomitant solidification of the locking-agent layer 55, and to increase the tendency of the indium of the metallic layers 51 and 52 to diffuse into the gold of the metallizations 17 and 18. The temperature in the indium layers does not exceed 70° C. during the third method step until completion of the diode laser component 80 as semiconductor module. However, a material-locked connection of the laser diode bar 10 to both heat-conducting bodies 20 and 30 is achieved by the diffusion of the solid indium into the solid gold. The production of the diode laser component 80 is completed by the solidification of the joining means 55, which forms a stable material-locked connection between the two heat-conducting bodies 20 and 30 away from the laser diode element 10, and the cooling of the arrangement back to room temperature. The material locking formed by the joining means 55 at least partly maintains the pressure loading of the heat-conducting bodies 20 and 30 on the indium layers 51 and 52, with the result that the indium layers 51 and 52 are protected against tensile, shearing and peeling stress and an adequate electrical and thermal contacting of the laser diode element 10 can also be guaranteed during operation of the diode laser component 80. To cool the diode laser component in operation a cooling element (not shown) is connected to the contacting surface 22 on the side facing away from the laser diode bar 10 of the first heat-conducting body. The emission direction of the diode laser radiation emitted during operation is indicated by the arrow 15 in FIG. 1b.

Because the indium layers 51 and 52 can also be solder layers, but are not used as such in the present case, because at no point during the production of the diode laser module is the melt temperature of indium—namely 157° C.—exceeded in either of the two indium layers 51 and 52, this production method can be described as clamping of the laser diode bar 10.

In contrast, a production method in which the melt temperature of one or both indium layers 51 and 52 is exceeded is described as soldering of the laser diode bar 10. As a rule, a soldering should have better thermal properties—expressed as thermal resistance—of the diode laser component than a clamping. A disadvantage with soldering is the material locking produced at melt temperature (better: solidification temperature) of the solder which, in particular during soldering of both sides of both indium layers 51 and 52, in particular with an inhomogeneous course over the width of the laser diode bar 10 from emitter to emitter, introduces high mechanical stresses into the laser diode bar 10. As the optical properties of the radiation of the emitter depend greatly on the stress state in the respective emitter, corresponding inhomogeneous radiation properties of different regions of the laser diode bar 10 are to be expected.

Figure 1C:
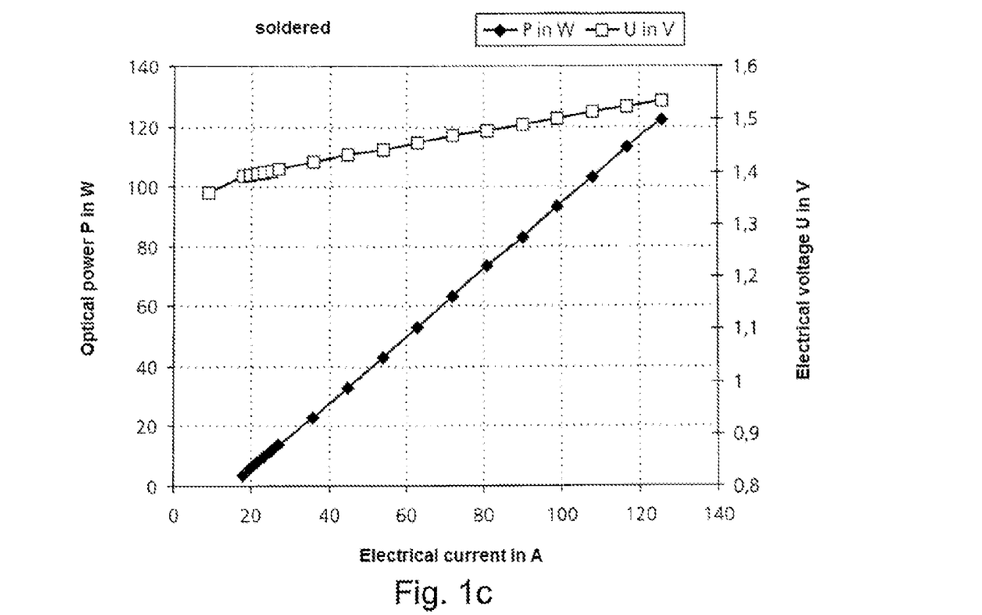
Figure 1D:
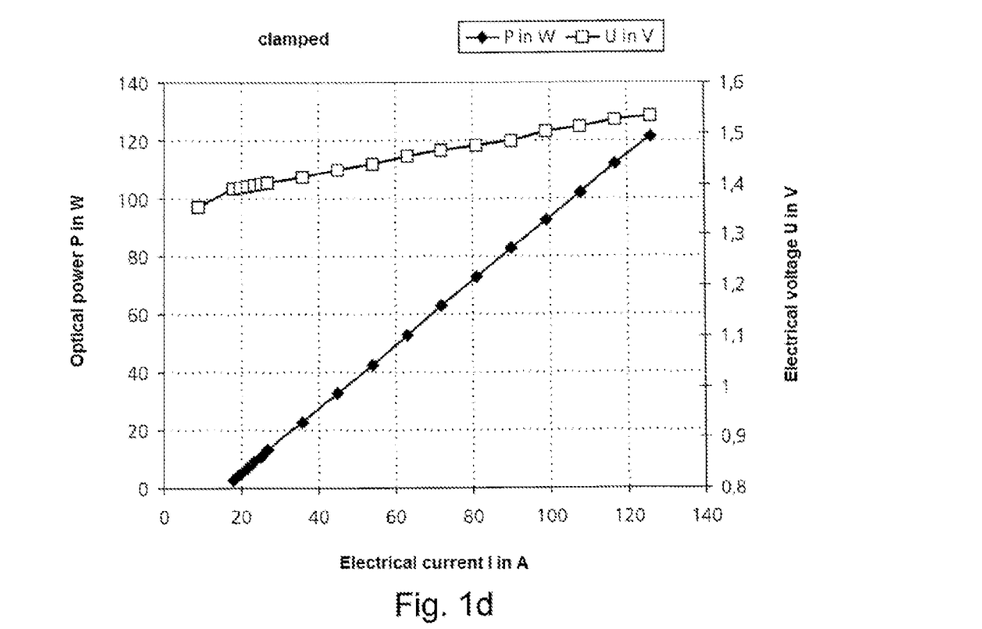

For a comparison of laser diode bars 10 soldered on both sides with indium solder and laser diode bars 10 clamped on both sides with indium layers 51 and 52 of an emission wavelength in the region of 940 nm, several diode laser components 80 of both variants were produced and compared with each other. FIGS. 1c to 1f reproduce the properties of the respective representative with the highest electro-optic efficiency at an optical nominal power of 120 W of each variant. FIG. 1c shows the current-light graph/current-voltage graph of the relevant diode laser component 80 soldered on both sides and FIG. 1d shows the current-light graph/current-voltage graph of the relevant diode laser component 80 clamped on both sides produced according to the invention. The electro-optical, mechanical and thermal properties of both variants are compared in Tab. 1:

TABLE 1 comparison of laser diode bars soldered on both sides and clamped on both sides.

| | threshold current | transconductance | efficiency | thermal resistance | smile |
|---|---|---|---|---|---|
| soldered | 14.4 A | 1.1 W/A | 63% | 0.38 K/W | 1.5 μm |
| clamped | 15.3 A | 1.1 W/A | 63% | 0.37 K/W | 0.6 μm |

It is shown that the clamped variant has an electro-optical efficiency comparable with the soldered variant. The thermal properties are also very similar. With regard to thermal resistance, it is to be pointed out that its establishment is influenced by thermomechanic mechanisms with the result that a systematic error of +/−0.03 K/W is to be assumed. The smile denotes the curvature of the laser diode bar 10 along its broad axis expressed as the sum of the two maximum positive and negative deviations from a straight line interpolated from the measurement values. Here, the clamped is clearly to be preferred to the soldered variant, the effect of which is particularly positive with regard to the efficiency during coupling in of the radiation of several emitters in an optical fibre.

Figure 1E:
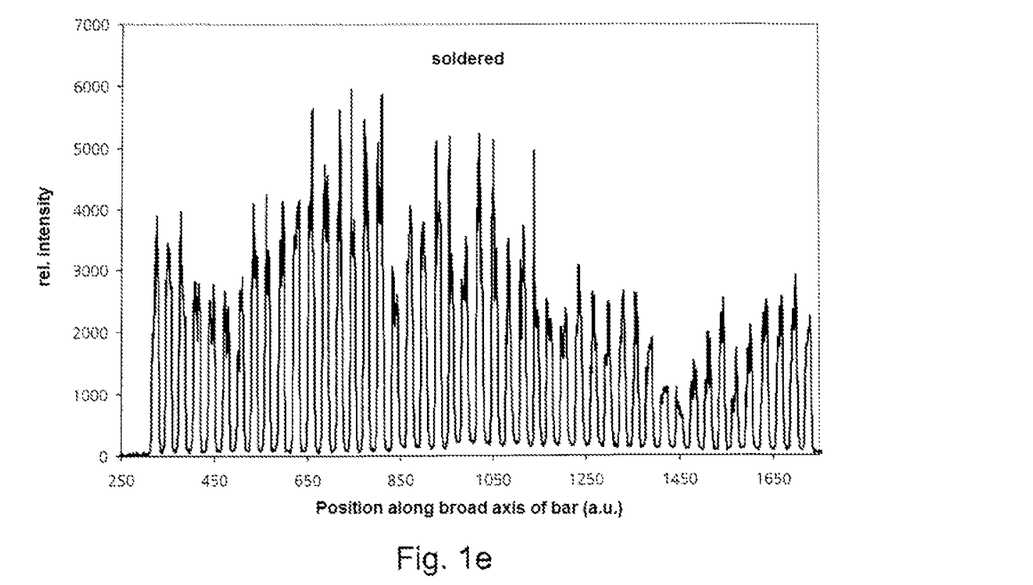
Figure 1F:
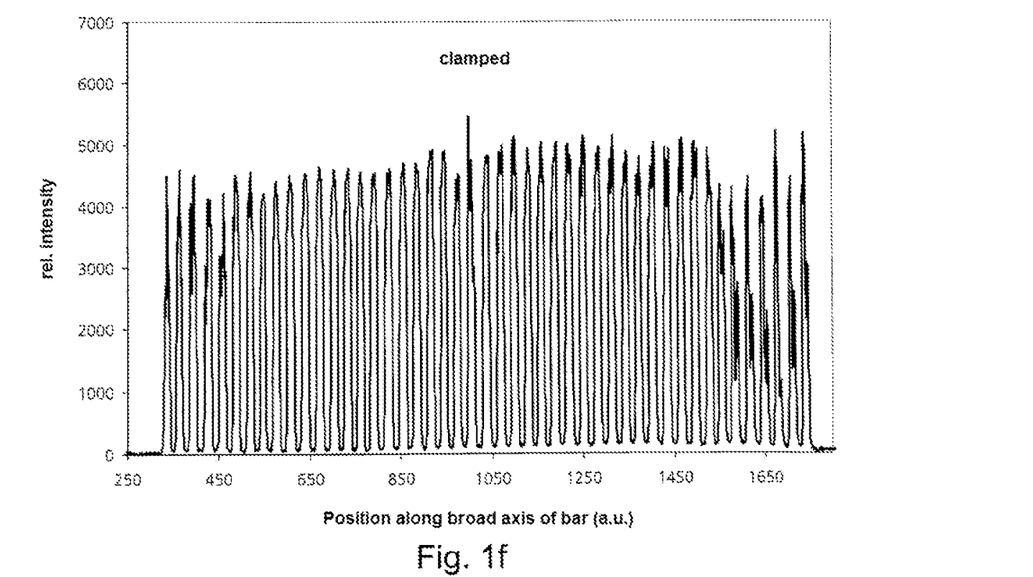

FIG. 1e shows the near-field profile of the optical power distribution of emitters of the soldered diode laser component 80 and FIG. 1f shows the near-field profile of the optical power distribution of emitters of the diode laser component 80 clamped on both sides. As already emphasized above in the description of the invention, there is a clearly better uniformity of power with the optical power values of the emitters of the clamped laser diode bar 10 than with the emitters of the soldered laser diode bar 10.

Second Embodiment Example

Unlike the first embodiment example double-sided clamping is not carried out to produce the diode laser component of the second embodiment example, only a single-sided (substrate-side) clamping of the laser diode bar 10, after the epitaxial side 11 of the laser diode bar 10 has been soldered onto the first heat-conducting body 20.

Figure 2A:
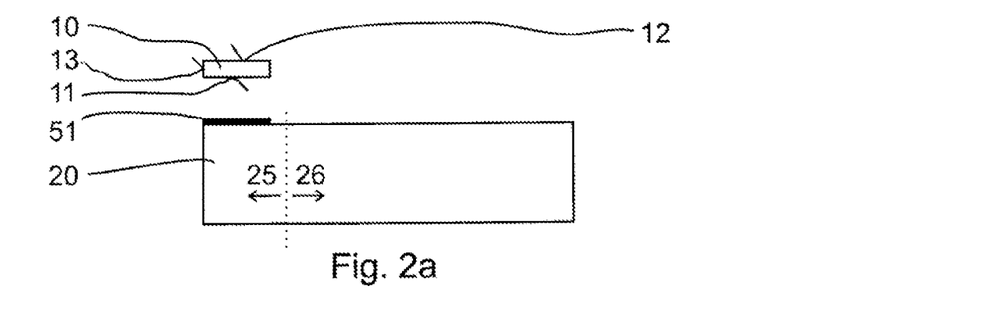
Figure 2B:
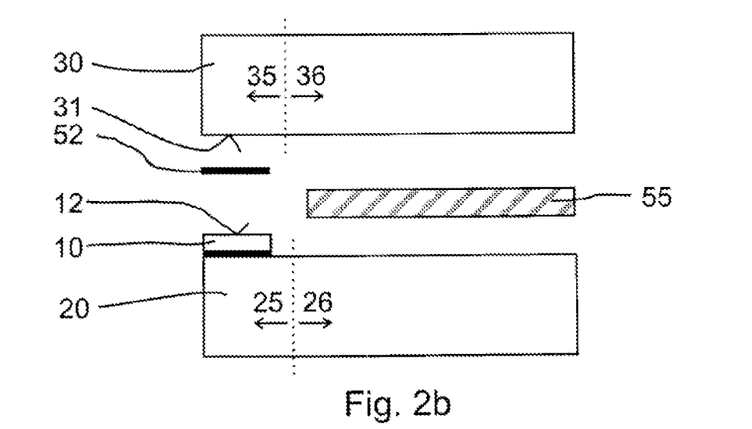
Figure 2C:
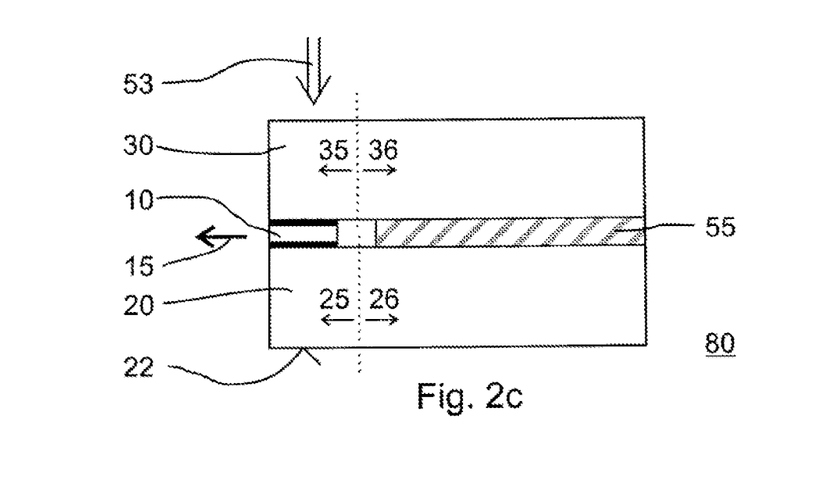

The first heat-conducting body 20 consists of a silver-diamond composite material core which on the outside, at least on the laser diode bar 10 and on the side facing away from the laser diode bar 10, has a copper layer which can easily be machined in order to produce smooth bonding surfaces. Silver and diamond of the first heat-conducting body are in a mixture ratio which gives the first heat-conducting body 20 a thermal expansion coefficient which is only 0.5 to 1.5 ppm/K greater than the thermal expansion coefficient of the laser diode bar 10. Thus a low-stress epitaxial-side hard soldering of the laser diode bar 10 on the heat-conducting body 20 is possible. For this, in the first method step a gold-tin solder layer 51 is applied to the side facing the laser diode bar 10 of the contact section 25 of the first heat-conducting body 20 which has eutectic gold-tin in the weight ratio of gold-tin of 80:20 (FIG. 2a). In a first section of the second method step the laser diode bar 10 is thus soldered via its epitaxial-side contact surface 11 to the first heat-conducting body 20. In a following second section of the second method step an indium foil 52 of from 5 µm to 100 µm thick is applied between the laser diode bars 10 and the second contact section 35 of a second copper heat-conducting body 30 and an electrically insulating joining means 55 between the connecting sections 26 and 36, opposing each other, of the first and second heat-conducting bodies 20 and 30 (FIG. 2b). In the third method step, a compressive force 53 and heat are applied, wherein the temperature in the indium layer 52 does not exceed 100° C. Some of the indium diffuses into the substrate-side gold layer of the second contact surface 12 of the laser diode bar and some into the copper of the second heat-conducting body 30, the surface of which has been sufficiently freed of oxygen beforehand at least in the diffusion region.

The production process of the diode laser component 80 is completed with the curing of the joining means 55.

Third Embodiment Example

Figure 3A:
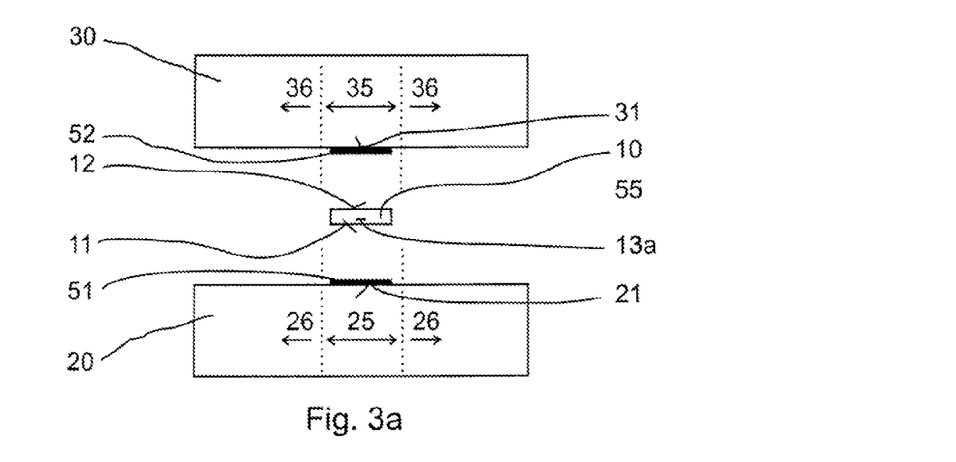

A laser diode 10 with an emitter 13a is used as laser diode element in the third embodiment example. As the resonator length in depth direction of FIG. 3a is greater than the width of the laser diode 10, a spreading of heat to both sides, left and right, parallel to the contact surfaces 11 and 12 of the laser diode 10 and perpendicular to the resonator direction or light-emission direction 15, is advantageous. In this sense the first and second heat-conducting bodies 20 and 30 each have two opposite-facing connecting sections 26 and 36—a left-hand one a right-hand one—between each of which lies the respective contact section 25 and 35.

In the vacuum, the connection surfaces 21 and 31 of the contact sections 25 and 35 are freed with a suitable method of the native aluminium-oxide layer of the heat-conducting bodies 20 and 30 consisting of aluminium. Without then being subjected to an oxidizing ambient atmosphere, the contact surfaces 21 and 31 of the contact sections 25 and 36 are metallized in the vacuum with, in each case, an indium layer 51 and 52 respectively (FIG. 3a). The respective connection surface 21/31 is protected against oxidation by the indium layer 51/52, with the result that even in an oxidizing ambient atmosphere a low-resistance electrical junction between the indium layer 51/52 and the respective heat-conducting body 20/30 can be established and maintained.

Figure 3B:
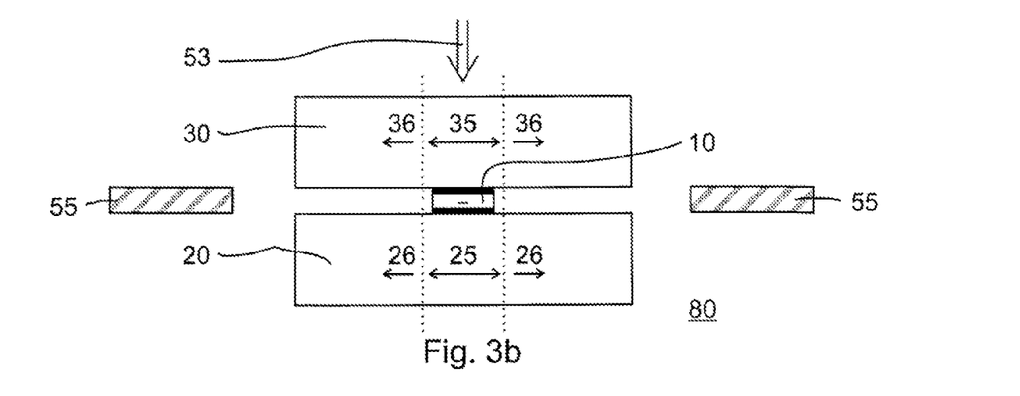
Figure 3C:
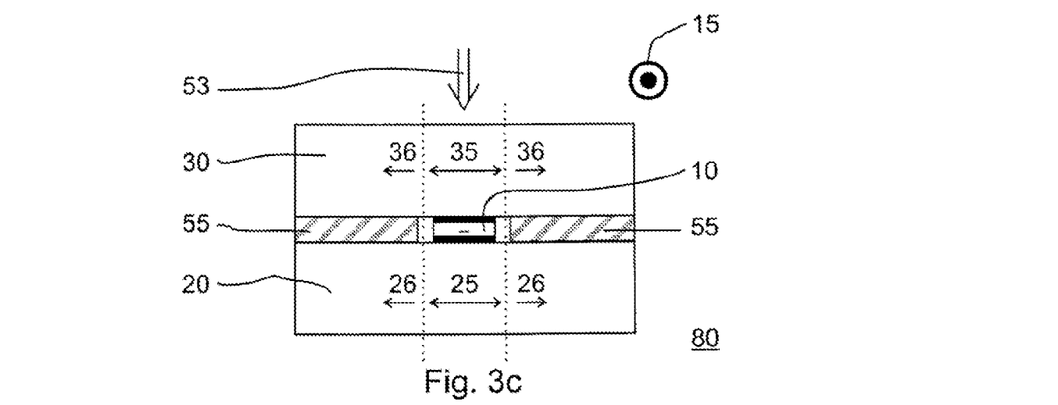

In a first section of the third method step according to the invention firstly the arrangement comprising first heat-conducting body 20, laser diode 10 and second heat-conducting body 30 is exposed to pressure 53 in order to achieve a friction-locked connection of the components without a joining means 55 being present between the connecting sections 26 and 36 of the heat-conducting bodies 20 and 30 (FIG. 3b). This joining means 55 is not introduced between the connecting sections 26 and 36 until during the third method step according to the invention, while maintaining the pressure 53. Thus it is not present until a second section of the third method step according to the invention between the connecting sections 26 and 36 during which it solidifies, while maintaining the pressure 53, and contributes to a material locking between the heat-conducting bodies 20 and 30. The joining means need not necessarily be electrically insulating, because the superficial native aluminium oxide layers of the heat-conducting bodies 20 and 30 already ensure electrical insulation and thus the necessary potential separation of the heat-conducting bodies 20 and 30 from each other.

In a first alternative production variant, the connection surfaces 21/31, after having been freed in the vacuum of the native aluminium oxide layer, are provided in the vacuum with a titanium-platinum-gold metallization which serves as protection against oxidation. The indium layer is introduced into the arrangement, instead of by vapour-deposition, by inserting in each case an indium foil 51/52 between the connection surfaces 21/31 and the electrical contact surfaces 11/12.

In a second alternative production variant, after the cleaning of the connection surfaces 21/31 of the aluminium surface in the vacuum, laser diodes 10 are inserted between the contact sections 25/35 and also indium foil 51/52 on both sides of the laser diodes 10 between the respective contact sections 25/35 and the laser diode in the same vacuum. The force 53 is likewise applied in the vacuum. During the venting of the process space the force 53 remains until finally the joining means is introduced between the connecting sections 26 and 36 and is cured.

Fourth Embodiment Example

Figure 4A:
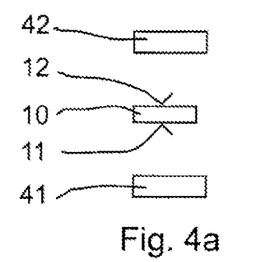
Figure 4B:
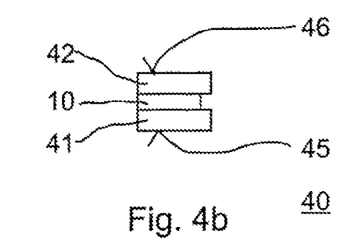

In the fourth embodiment example the semiconductor component arrangement is not provided, as in the three previous embodiment examples by a laser diode element, but by a diode laser sub-assembly 40 with a laser diode bar 10 to the epitaxial-side contact surface 11 of which a first electrically conductive contact body 41 is fixed in material-locked manner and to the substrate-side contact surface 12 of which a second electrically conductive contact body 42 is fixed in material-locked manner. (FIG. 4a, FIG. 4b). Both electrically conductive contact bodies 41 and 42 are provided by gold-metallized, 300 µm-thick copper-tungsten substrates (CuW substrates) which contain a copper-tungsten composite, is present with a ratio of parts of copper and parts of tungsten such that a thermal expansion coefficient which differs from that of the laser diode bar 10 by not more than 2 ppm/K results for the copper-tungsten substrates. For a GaAs laser diode bar 10 the ratio of parts by weight of copper to tungsten is preferably 10 to 90.

The CuW substrates 41 and 42 are soldered to the laser diode bar 10 by means of gold-tin solder which contains gold and tin in the weight ratio of 80 to 20. Unlike indium, the gold-tin solder is stable under comparatively high thermomechanical and electromechanical alternating loads, with the result that the direct electrical contacting of the laser diode bar by using the contact bodies 41 and 42 is also protected against degradation even when there are high power requirements.

The diode laser sub-assembly 40 has at its first contact body 41 a first thermal contact surface 45 facing away from the laser diode bar 10, and at its second contact body 42 a second thermal contact surface 46 facing away from the laser diode bar 10, lying opposite the first thermal contact surface 45.

Figure 4C:
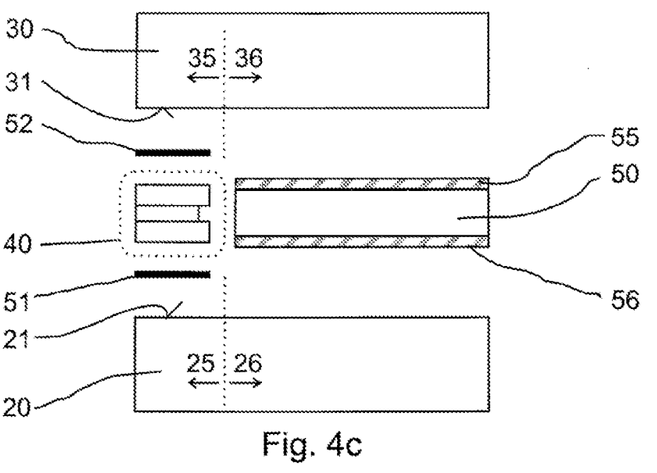

The first thermal contact surface 45 is ready to be electrically and thermally bonded by a first copper heat-conducting body 20 (FIG. 4c). The second thermal contact surface 46 is ready to be electrically and thermally bonded by a second copper heat-conducting body 30. Both heat-conducting bodies 20 and 30 respectively have contact sections 25 and 35 according to the invention in perpendicular projection of the diode laser sub-assembly 40 towards the pn transitions of its laser diode bar 10 respectively with connection surfaces 21 and 31 respectively facing the diode laser sub-assembly 40. Both heat-conducting bodies 20 and 30 respectively have connecting sections 26 and 36 according to the invention which extend opposite each other outside the said perpendicular projection.

A first, 50 μm-thick indium foil 51 is introduced between the first connection surface 21 and the first thermal contact surface 45. A second, 50 μm-thick indium foil 52 is introduced between the second connection surface 31 and the second thermal contact surface 46. A 750 μm-thick aluminium oxide/ceramic sheet, provided on both sides with epoxide resin adhesive layers 55 and 56, is introduced between the first connecting section 26 and the second connecting section.

Figure 4D:
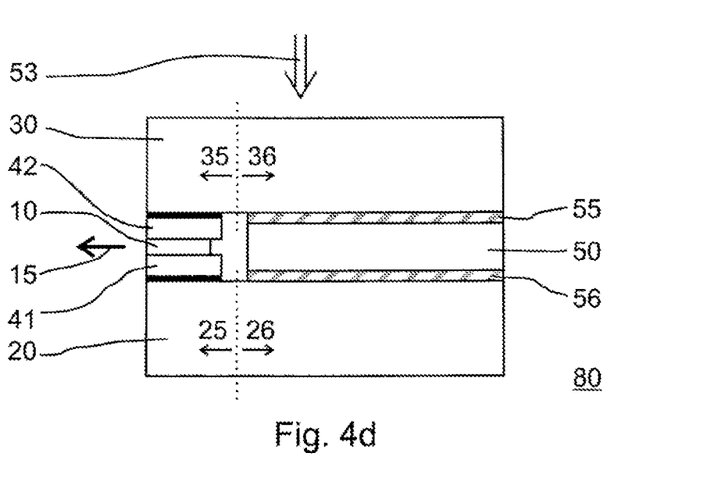

In the connection step of the production method, a force 53 is applied externally to the side facing away from the diode laser sub-assembly 40 of the second heat-conducting body 30, while the side facing away from the diode laser sub-assembly 40 of the first heat-conducting body 20 rests firmly on the heating plate of an oven. The processing temperature exceeds 70° C. However, it does not exceed 100° C. A material-locked diode laser component unit, which is also stabilized by the material locking, due to the adhesive layers 55 and 56, between the two connecting sections, is achieved by solids diffusion of the indium of the indium foils 51 and 52 both into the near-surface copper of the heat-conducting bodies 20 and 30 and into the gold metallization of the CuW substrates.

Fifth Embodiment Example

The fifth embodiment example differs from the fourth embodiment example in that, instead of the laser diode bar with numerous emitters, a so-called mini-bar 10, 120 μm-thick, with a 2×3 field of emitters which are arranged in two rows each with three emitters one above the other is used, wherein the distance between the two rows is 2 to 5 μm. Such a structure of emitters arranged on top of each other can be produced epitactically by means of MOCVD (metal organic chemical vapor deposition) of the MBE (molecular beam epitaxy).

Figure 5A:
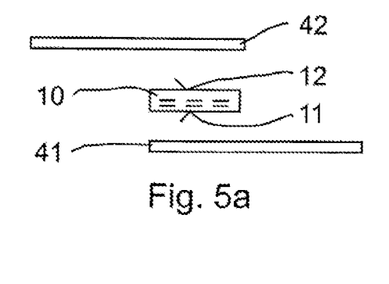
Figure 5B:
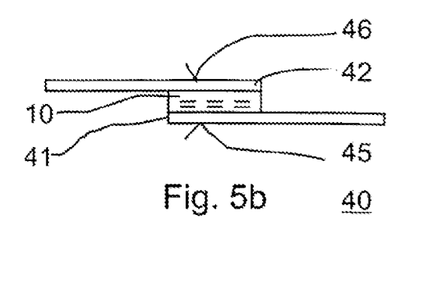

Molybdenum strips, copper-coated on both sides, each with an overall thickness of 50 μm, serve as contact bodies 41 and 42, which are attached, using a gold-tin solder, to opposing contact surfaces 11 and 12 of the mini-bar, such that their free end-sections project on opposite sides of the mini-bar, parallel to the contact surfaces and perpendicular to the radiation direction 15 beyond the mini-bar 10 (FIG. 5b).

Figure 5C:
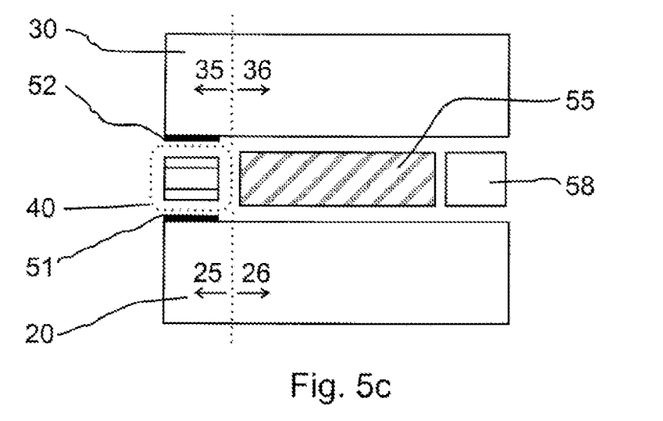
Figure 5D:
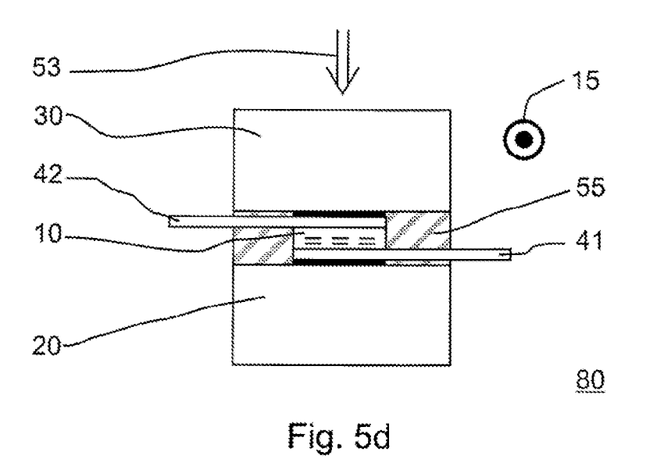

The heat-conducting bodies 20 and 30 are aluminium cuboids which have a superficial, native or artificially strengthened oxide layer with electrically insulating property. Onto this oxide layer in each case, a thin, 10 μm-thick indium layer 51 and 52 is applied to each of the contact sections 25 and 35 of the heat-conducting bodies 20 and 30 (FIG. 5c). A 250 μm-thick layer 55 of electrically conductive silver-filled epoxide resin adhesive is introduced between the connecting sections 26 and 36 of the heat-conducting bodies 20 and 30. A short circuit between the contact surfaces 11 and 12 of the mini-bar 10 is prevented by the superficial oxide layers of the aluminium-heat-conducting bodies 20 and 30. A 230 μm-thick spacer 58, which is intended to prevent the heat-conducting bodies 20 and 30 from tilting towards each other in the connection process, is located on the side facing away from the diode laser sub-assembly 40. Exposure to force and heat takes place, as in the previous embodiment example, but with the different result that the aluminium heat-conducting bodies 20 and 30 bond to the diode laser sub-assembly 40 only in force-locking manner, because the indium of the indium layers 51 and 52 does not wet the (aluminium) oxide layers of the heat-conducting bodies. This friction locking is stabilized by the material locking between the connecting sections 26 and 36 of the heat-conducting bodies 20 and 30 which is mediated by the solidified adhesive 55.

The free end-sections of the molybdenum strips 41 and 42 project laterally, on opposite sides, beyond the heat-conducting bodies 20 and 30 and are present for electrical bonding, while the heat-conducting bodies 20 and 30 alone require thermal bonding.

It is understood that individual or several features of the embodiment examples can be exchanged for one another and combined with each other without going beyond the content of the scope of the invention.

While the invention has been described in connection with what is presently considered to be the most practical and preferred embodiments, it will be apparent to those of ordinary skill in the art that the invention is not to be limited to the disclosed embodiments. It will be readily apparent to those of ordinary skill in the art that many modifications and equivalent arrangements can be made thereof without departing from the spirit and scope of the present disclosure, such scope to be accorded the broadest interpretation of the appended claims so as to encompass all equivalent structures and products.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

LIST OF REFERENCE NUMBERS

| 10 | Laser diode element |
| 11 | First electrical contact surface |
| 12 | Second electrical contact surface |
| 13 | Radiation emission surface |
| 13a | Radiation emission section, emitter |
| 15 | Radiation emission direction symbol |
| 16 | First contact layer |

| | |
|---|---|
| 17 | Second contact layer |
| 20 | First heat-conducting body |
| 21 | First connection surface/heat-entry surface |
| 22 | Bonding surface of the first heat-conducting body 20 |
| 25 | Contact section of the first heat-conducting body 20 |
| 26 | Connection section of the first heat-conducting body 20 |
| 30 | Second heat-conducting body |
| 31 | Second connection surface/heat-entry surface |
| 32 | Bonding surface of the second heat-conducting body 30 |
| 35 | Contact section of the second heat-conducting body 30 |
| 36 | Connection section of the second heat-conducting body 30 |
| 40 | Diode laser sub-assembly |
| 41 | First contact body |
| 42 | Second contact body |
| 45 | First thermal contact surface |
| 46 | Second thermal contact surface |
| 50 | Intermediate piece |
| 51 | First metallic layer |
| 52 | Second metallic layer |
| 53 | Force direction symbol |
| 55 | First jointing means layer |
| 56 | Second jointing means layer |
| 58 | Spacer |
| 80 | Diode laser component |

What is claimed is:

1. A method for producing a semiconductor module, comprising:
   providing a semiconductor component arrangement including a first side including at least one first electrical connection with a first contact surface a second side opposite the first side including at least one second electrical connection with a second contact surface;
   providing a first heat-conducting body;
   providing at least one second heat-conducting body;
   providing a first metallic layer;
   providing at least one second metallic layer;
   providing a joining means;
   arranging the semiconductor component arrangement between the first and the second heat-conducting bodies such that a first contact section of the first heat-conducting body lies opposite the first contact surface, a second contact section of the second heat-conducting body lies opposite the second contact surface, wherein at least sections of the first metallic layer are arranged between the first contact section and the first contact surface, at least sections of the second metallic layer are arranged between the second contact section and the second contact surface;
   producing at least one force, at least components of which are effectively oriented by one of the two heat-conducting bodies in the direction of the other heat-conducting body; and
   creating a material-locked connection of the two heat-conducting bodies by solidification of the joining means,
   wherein the temperature in the step of producing at least one force in the second metallic layer does not exceed the melt temperature of the metallic material of the second metallic layer which has the lowest melt temperature.

2. The method according to claim 1, wherein in the step of producing at least one force, the production of the at least one force is carried out at the same time as the creation of the material-locked connection.

3. The method according to claim 1, wherein a first connecting section of the first heat-conducting body lies opposite a second connecting section of the second heat-conducting body away from the semiconductor component arrangement, and at least sections of the joining means are arranged between the first connecting section and the second connecting section.

4. The method according to claim 1, wherein the force produced in the step of producing at least one force is an external force which is applied from outside onto at least one of the heat-conducting bodies and of which at least components are oriented in the direction of the other heat-conducting body, wherein the step of producing at least one force is followed by the step of partly or completely removing the external force.

5. The method according to claim 1, wherein in the step of arranging the semiconductor component arrangement, a material-locked connection takes place between the first contact section and the semiconductor component arrangement involving at least one metallic material of the first metallic layer arranged between the first contact section and the semiconductor component arrangement.

6. The method according to claim 1, wherein in the step of producing at least one force, the formation of a force-locking connection between the second contact section and the second contact surface takes place, which is maintained by the solidified joining means.

7. The method according to claim 1, wherein in the step of producing at least one force, the formation of a material-locked connection between the second contact section and the semiconductor component arrangement takes place by solids diffusion of at least one metallic material of the second metallic layer into a metallic surface region of at least one of the second contact section and the second electrical connection, and by solids diffusion of at least one metallic material of the surface region of at least one of the second contact section and the second electrical connection into the second metallic layer without one of the metallic materials of the second metallic layer, of the surface region of the second contact section or of the second electrical connection, one of its formed compounds or one of their formed mixtures with one another or with one or more of its formed compounds passing over into a liquid state.

8. The method according to claim 1, wherein in the step of producing at least one force, the temperature in the first metallic layer and the second metallic layer does not exceed the melt temperatures of those materials in the respective layers with the respective lowest melt temperatures.

9. The method according to claim 8, wherein in the step of producing at least one force, the formation of a friction-locked connection between the second contact section and the second contact surface and the formation of a friction-locked connection between the first contact section and the first contact surface take place, which are maintained by the solidified joining means.

10. The method according to claim 8, wherein in the step of producing at least one force, the formation of a material-locked connection between the second contact section and the semiconductor component arrangement takes place by solids diffusion at least of one metallic material of the second metallic layer into a metallic surface region of at least one of the second contact section and of the second electrical connection and by solids diffusion of at least one metallic material of the surface region of at least one of the second contact section and of the second electrical connection into the second metallic layer without one of the metallic materials of the second metallic layer, of the surface region of the second contact section or of the second electrical connection, one of its formed compounds or one of their formed mixtures with one another or with one or more of its formed compounds passing over into a liquid state, and the formation of a material-locked connection between the first contact section and the semiconductor component arrangement by solids diffusion at least of one metallic material of the first metallic layer into a metallic surface region of at least one of the first contact section and of the first electrical connection and by solids diffusion of at least one metallic material of the surface region of at least one of the first contact section and of the first electrical connection into the first metallic layer takes place without one of the metallic materials of the first metallic layer, of the surface region of the first contact section or of the first electrical connection, one of its developed compounds or one of their developed mixtures one under the other or with one or more of its developed compounds, going over into a liquid state.

11. The method according to claim 1, wherein at least the method the step of producing at least one force takes place in the vacuum or in a chemically inert or reducing atmosphere with regard to at least one of the first and second metallic material of at least one of the first and second metallic layers.

12. The method according to claim 1, wherein the first and the second heat-conducting bodies comprise at least one metal-containing material and the joining means is an electrically insulating joining means selected from the group consisting of duroplasts and cements.

13. The method according to claim 1, wherein in at least one of the step of providing a semiconductor component arrangement and the step of arranging the semiconductor component arrangement, the first metallic layer is applied to the first contact surface or first heat-entry surface facing the semiconductor component arrangement of at least one of the first contact section and the second metallic layer is applied to the second contact surface or to a second heat-entry surface facing the semiconductor component arrangement of the second contact section.

14. The method according to claim 1, wherein at least one material of at least one of the first and second layers contains a chemical element from the group indium, tin, lead and cadmium.

15. The method according to claim 14, wherein, with regard to proportions by one or more of weight, atom and volume, at least one of the first and second metallic layers comprise mainly indium and during the method the step of producing at least one force, the temperature of at least one of the first and second metallic layers is at least sometimes above 30° C.

16. The method according to claim 1, wherein the semiconductor component arrangement is formed as semiconductor component and the electrical connections are formed by at least one first metal layer on the first side of the semiconductor component and at least one second metal layer on the second side of the semiconductor component, wherein the first contact surface is arranged on the side facing away from the semiconductor component of the first metal layer and the second contact surface is arranged on the side facing away from semiconductor component of the second metal layer.

17. The method according to claim 16, wherein with regard to at least one of weight, atom and volume proportions, the first and the second heat-conducting bodies comprise mainly at least one of copper and aluminum.

18. The method according to claim 1, wherein the semiconductor component arrangement has at least one semiconductor component, the first electrical connection is formed as at least a first electrically conductive contact body which is fixed in material-locked manner by means of a first electrically conductive joining means to a first side of the semiconductor component and the second electrical connection is formed as a second electrically conductive contact body which is fixed in material-locked manner by means of a second electrically conductive joining means to a second side opposite the first side of the semiconductor component of the semiconductor component.

19. The method according to claim 18, wherein at least one of the first and second electrically conductive joining means includes gold and tin and at least one of the first and second electrically conductive contact body includes one or more of tungsten, molybdenum, carbon, boron, nitride and silicon carbide.

20. Method according to claim 1, wherein at least one of the first heat-conducting body and the second heat-conducting body is a cooling element.

21. Method according to claim 1, wherein at least one of the first heat-conducting body and the second heat-conducting body is attached to at least one cooling element.

* * * * *